(12) United States Patent
Jen et al.

(10) Patent No.: US 11,101,179 B2
(45) Date of Patent: Aug. 24, 2021

(54) SEMICONDUCTOR STRUCTURE WITH PROTECTION PORTIONS AND METHOD FOR FORMING THE SAME

(71) Applicant: Winbond Electronics Corp., Taichung (TW)

(72) Inventors: Kai Jen, Taichung (TW); Li-Ting Wang, Taichung (TW); Yi-Hao Chien, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 59 days.

(21) Appl. No.: 16/508,875

(22) Filed: Jul. 11, 2019

(65) Prior Publication Data

US 2021/0013104 A1 Jan. 14, 2021

(51) Int. Cl.
*H01L 21/8234* (2006.01)
*H01L 27/108* (2006.01)
*H01L 21/768* (2006.01)

(52) U.S. Cl.
CPC ......... *H01L 21/823462* (2013.01); *H01L 21/76814* (2013.01); *H01L 21/823468* (2013.01); *H01L 27/10844* (2013.01)

(58) Field of Classification Search
CPC ..... H01L 21/823462; H01L 21/823864; H01L 21/76814; H01L 21/823468; H01L 29/6653; H01L 29/66553; H01L 29/6656; H01L 29/66689; H01L 29/66719

See application file for complete search history.

(56) References Cited

U.S. PATENT DOCUMENTS

| | | | |
|---|---|---|---|
| 2010/0022061 A1* | 1/2010 | Wu | H01L 29/7833 438/301 |
| 2017/0263778 A1* | 9/2017 | Zou | H01L 21/02164 |

FOREIGN PATENT DOCUMENTS

| | | |
|---|---|---|
| TW | 201318172 A | 5/2013 |
| TW | 201727769 A | 8/2017 |
| TW | 201733128 A | 9/2017 |
| TW | 201905985 A | 2/2019 |

* cited by examiner

*Primary Examiner* — Nelson Garces
(74) *Attorney, Agent, or Firm* — Muncy, Geissler, Olds & Lowe, P.C.

(57) ABSTRACT

A semiconductor structure includes a semiconductor substrate, a gate stack disposed over the semiconductor substrate, a first oxide spacer disposed along a sidewall of the gate stack, a protection portion disposed over the first oxide spacer, and an interlayer dielectric layer disposed over the semiconductor substrate. The first oxide spacer and the protection portion are disposed between the gate stack and the interlayer dielectric layer.

16 Claims, 11 Drawing Sheets

SEMICONDUCTOR STRUCTURE WITH PROTECTION PORTIONS AND METHOD FOR FORMING THE SAME

BACKGROUND

Field of the Disclosure

The present disclosure relates to a semiconductor structure, and in particular, it relates to a dynamic random-access memory.

Description of the Related Art

Dynamic Random-Access Memory (DRAM) devices are widely used in consumer electronic products. In order to increase element density in a DRAM device and improve its overall performance, existing technologies for fabricating DRAM devices continue to focus on scaling down the size of the elements.

However, in scaling down the size of the smallest elements, new challenges arise. For example, a void may be formed in a dielectric material. When a conductive material is filled into the void, the semiconductor device may short. Therefore, there is a need in the industry to improve the method for fabricating DRAM devices to overcome problems caused by scaling down the elements.

SUMMARY

In some embodiments of the disclosure, a method for fabricating a semiconductor structure is provided. The method includes providing a semiconductor substrate, forming a gate stack over the semiconductor substrate, forming an oxide spacer along a sidewall of the gate stack, and forming an ILD layer over the semiconductor substrate. The oxide spacer is located between the ILD layer and the gate stack. The method further includes removing an upper portion of the oxide spacer to form a void, and forming a protection portion in the void.

In some embodiments of the disclosure, a semiconductor structure is provided. The semiconductor structure includes a substrate, a gate stack disposed over the substrate, a first oxide spacer disposed along a sidewall of the gate stack, a protection portion disposed over the first oxide spacer, and an ILD layer disposed over the semiconductor substrate. The first oxide spacer and the protection portion are disposed between the gate stack and the ILD layer.

BRIEF DESCRIPTION OF THE DRAWINGS

The present disclosure can be further understood by reading the subsequent detailed description and examples with references made to the accompanying drawings, wherein.

DETAILED DESCRIPTION

The present disclosure is described in detail with reference to the figures of the embodiments of the present disclosure. It should be appreciated, however, that the present disclosure can be embodied in a wide variety of implements and is not limited to embodiments described in the disclosure. Various features may be arbitrarily drawn at different scales for the sake of simplicity and clarity. Throughout the various views and illustrative embodiments, like reference numbers are used to designate like elements.

Figure 9:
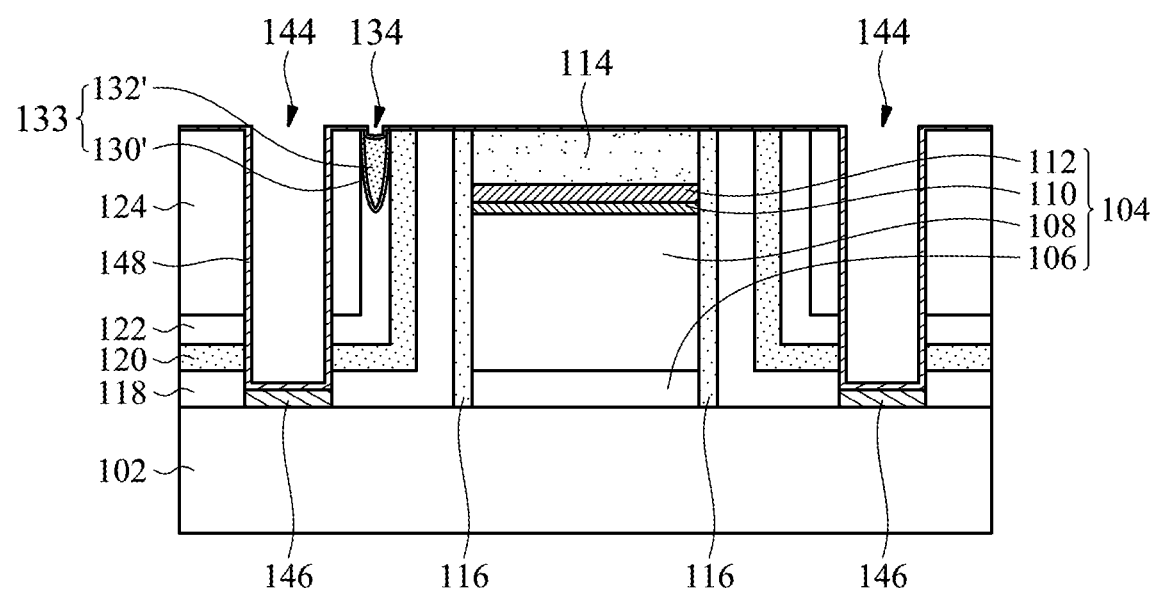
Figure 10:
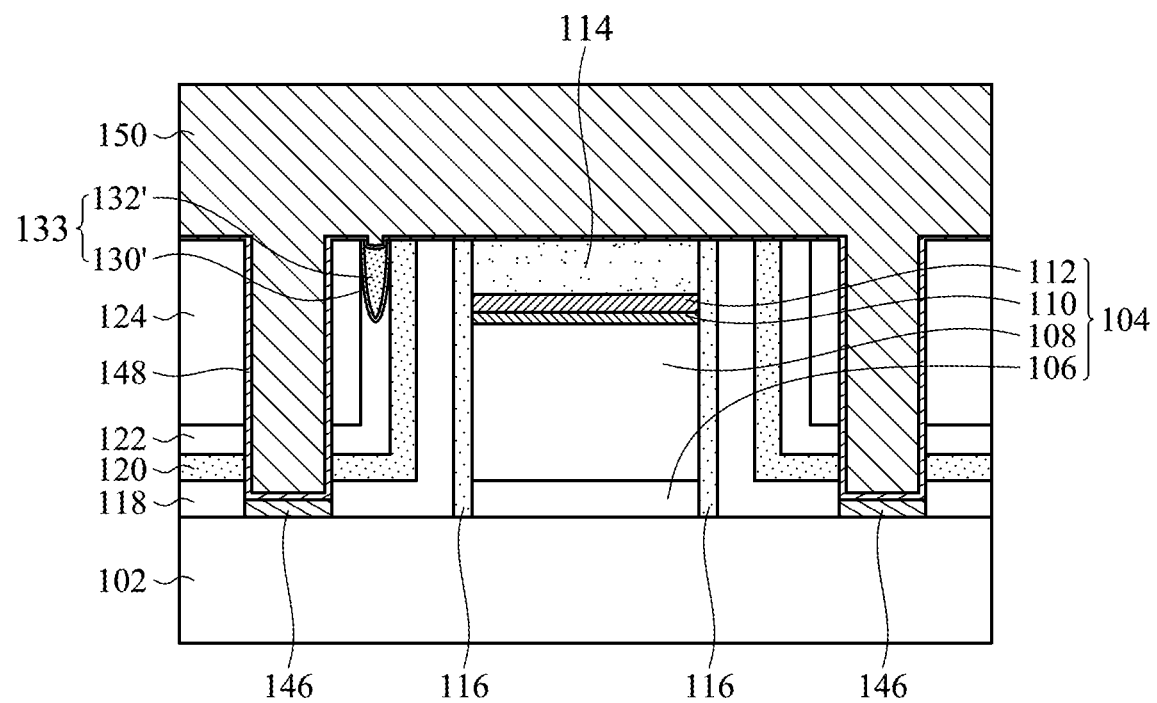
Figure 11:
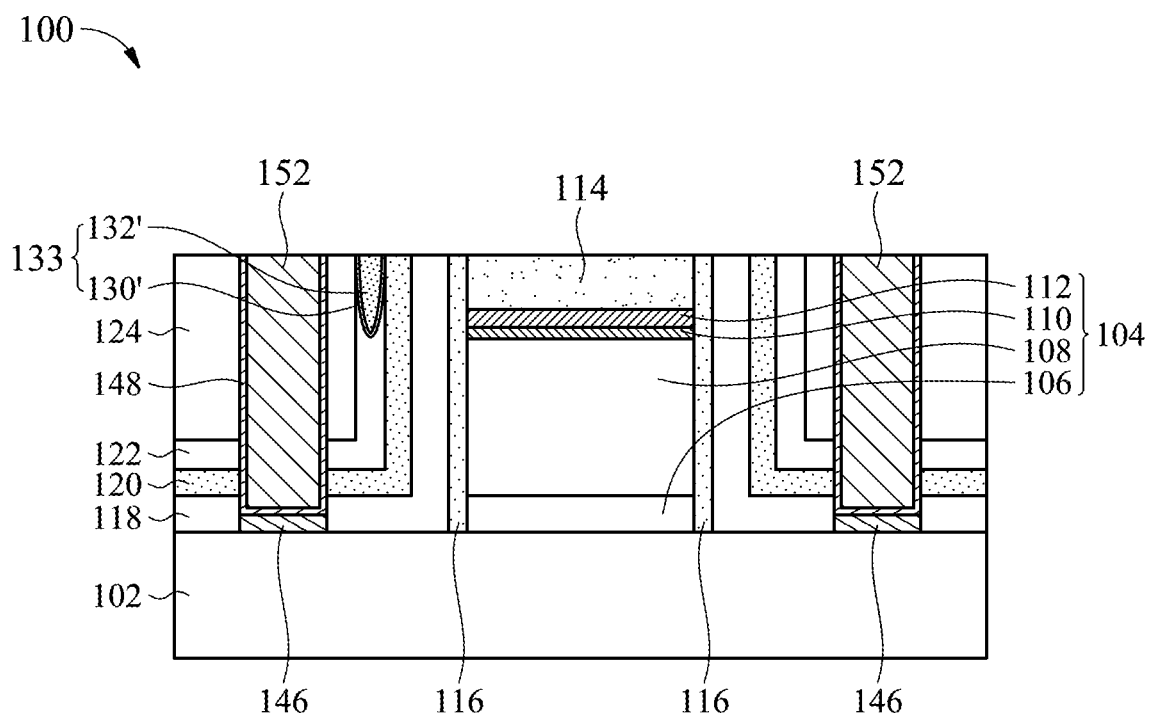

FIGS. 1-11 illustrate cross-sectional views at various stages of forming a semiconductor structure 100 as shown in FIG. 11, in accordance with some embodiments of the present disclosure.

Figure 1:
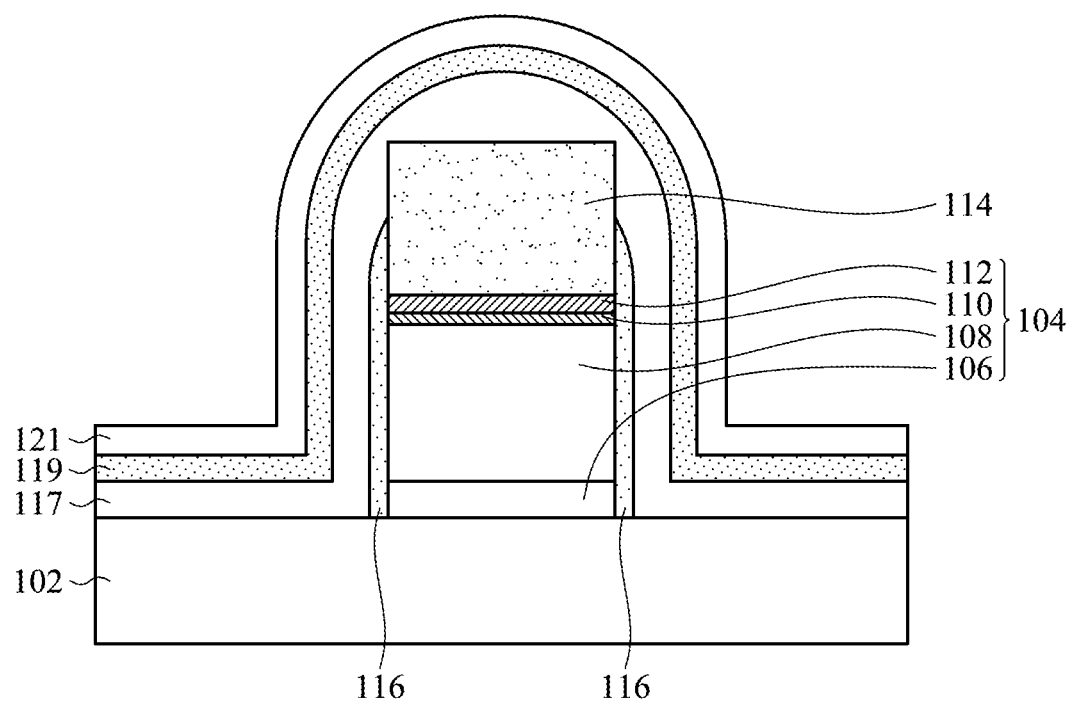
FIGS. 1-11 illustrate cross-sectional views at various stages of forming a semiconductor structure, in accordance with some embodiments of the present disclosure.

A semiconductor substrate 102 is provided, as shown in FIG. 1, in accordance with some embodiments. In some embodiments, the semiconductor substrate 102 may be an elemental semiconductor substrate, such as a silicon substrate or a germanium substrate; or a compound semiconductor substrate, such as a silicon carbide substrate or a gallium arsenide substrate. In some embodiments, the semiconductor substrate 102 may be a semiconductor-on-insulator (SOI) substrate.

A gate stack 104 is formed over the semiconductor substrate 102, as shown in FIG. 1, in accordance with some embodiments. The gate stack includes a gate dielectric layer 106, a first conductive layer 108, a barrier layer 110, and a second conductive layer 112 which are sequentially stacked over the semiconductor substrate 102, in accordance with some embodiments.

In some embodiments, the gate dielectric layer 106 is made of silicon oxide ($SiO_2$), silicon nitride (SiN), silicon oxynitride (SiON). In some embodiments, the gate dielectric layer 106 is formed by in-situ steam generation (ISSG), thermal oxidation, chemical vapor deposition (CVD) process, or a combination thereof.

In some embodiments, the first conductive layer 108 is made of a semiconductor material such as polysilicon. In some embodiments, the first conductive layer 108 is formed by CVD process. In some embodiments, the polysilicon may be doped or undoped.

In some embodiments, the barrier layer 110 is made of titanium nitride (TiN), tantalum nitride (TaN), or tungsten nitride (WN). In some embodiments, the barrier layer 110 is formed by physical vapor deposition (PVD) process, CVD process, or a combination thereof. In some embodiments, the barrier layer 110 may prevent atoms of the second conductive layer 112 from diffusing into underlying the first conductive layer 108 and may be used as an adhesive layer between the first conductive layer 108 and the second conductive layer 112.

In some embodiments, the second conductive layer 112 is made of a metal material such as tungsten (W), titanium (Ti), aluminum (Al), copper (Cu), molybdenum (Mo), nickel (Ni), platinum (Pt). In some embodiments, the second conductive layer 112 is formed by atomic layer deposition (ALD), CVD, PVD, or a combination thereof.

A capping layer 114 is formed over the upper surface of the gate stack 104, as shown in FIG. 1, in accordance with some embodiments. In some embodiments, the capping layer 114 is made of a dielectric material such as silicon nitride (SiN). In some embodiments, the capping layer 114 is formed by CVD such as plasma enhanced CVD (PECVD). In some embodiments, the sidewalls of the capping layer 114 are substantially aligned with the sidewalls of the gate stack 104.

A first nitride spacer 116 is formed along the sidewall of the gate stack 104 and the sidewall of the capping layer 114, as shown in FIG. 1, in accordance with some embodiments. In some embodiments, the first nitride spacer 116 covers a lower portion of the capping layer 114. In some embodiments, the first nitride spacer 116 is made of silicon nitride. In some embodiments, the first nitride spacer 116 is formed by a deposition process and an etching process. In some embodiments, the deposition process includes CVD such as PECVD, ALD, or a combination thereof.

An oxide layer 117, a nitride layer 119, an oxide layer 121 are sequentially and conformally formed along the upper surface of the semiconductor substrate 102, the sidewalls of the gate stack 104, and the upper surface and the sidewalls of the capping layer 114, as shown in FIG. 1, in accordance with some embodiments. The oxide layer 117 covers the first nitride spacer 116, in accordance with some embodiments.

In some embodiments, the oxide layer 117 is made of silicon oxide formed by tetraethoxysilane (TEOS). In some embodiments, the oxide layer 117 is formed by CVD such as PECVD, ALD, or a combination thereof.

In some embodiments, the nitride layer 119 is silicon nitride. In some embodiments, the nitride layer 119 is formed by CVD such as PECVD, ALD, or a combination thereof.

In some embodiments, the oxide layer 121 is made of silicon oxide. In some embodiments, the oxide layer 121 is formed by CVD such as PECVD, ALD, or a combination thereof.

Figure 2:
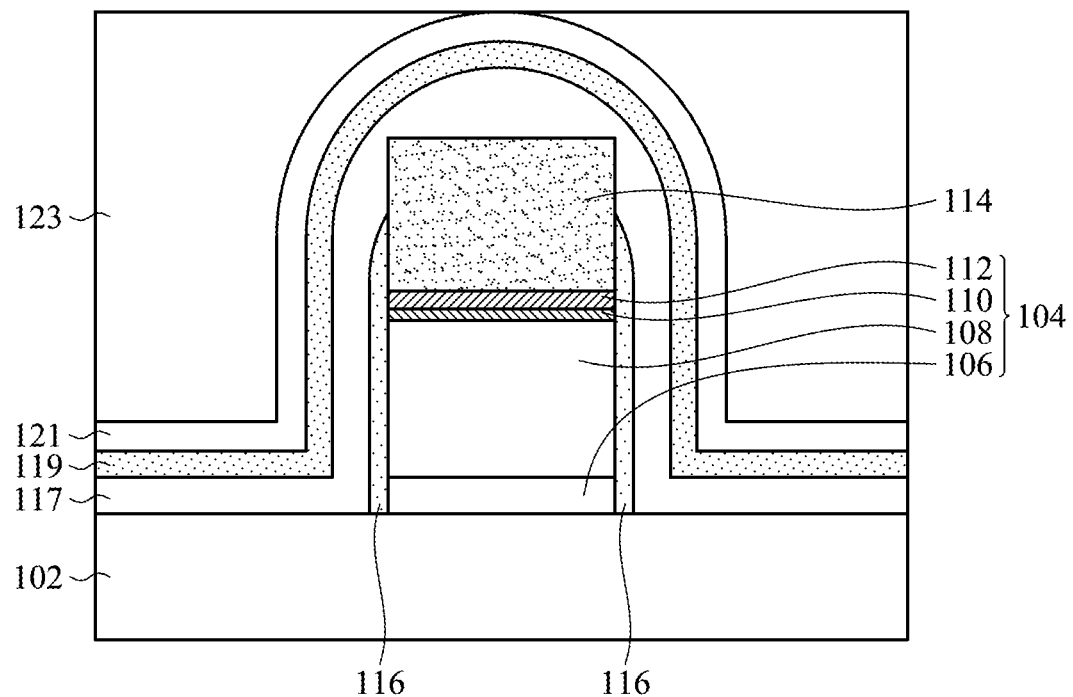

In some embodiments, a dielectric material 123 is formed over the semiconductor substrate 102, as shown in FIG. 2, in accordance with some embodiments. The dielectric material 123 covers the upper surface of the oxide layer 121, in accordance with some embodiments. The dielectric material 123 is a low-k dielectric material such as phosphosilicate glass (PSG), borophosphosilicate glass (BPSG), spin-on-glass (SOG), or a combination thereof. In some embodiments, the dielectric material 123 is formed by PECVD, or high density plasma CVD (HDP-CVD), or spin-on coating.

In some embodiments, the dielectric material 123 is spin-on-glass (SOG) that is planarized by an anneal process. In some embodiments, after the dielectric material 123 is formed (or anneal process if implemented), the dielectric material 123 is planarized by such as chemical mechanical polishing (CMP).

Figure 3:
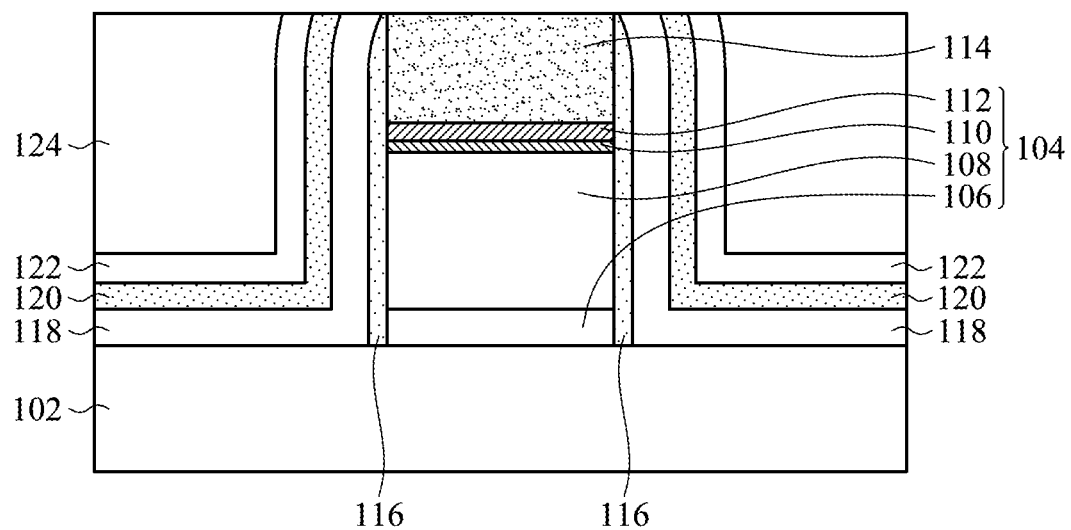

An etch-back process is performed on the dielectric material 123, in accordance with some embodiments to form an interlayer dielectric (ILD) layer 124, as shown in FIG. 3, in accordance with some embodiments. The etch-back process removes the dielectric material 123, the oxide layer 121, the nitride layer 119, and the oxide layer 117 above the upper surface of the capping layer 114 until the upper surface of the capping layer 114 is exposed, in accordance with some embodiments. In some embodiments, the etch-back process removes an upper portion of the first nitride spacer 116.

After the etch-back process, the oxide layer 117, the nitride layer 119, and the oxide layer 121 forms a first oxide spacer 118, a second nitride spacer 120, and a second oxide spacer 122, respectively, in accordance with some embodiments. The upper surfaces of the ILD layer 124, the second oxide spacer 122, the second nitride spacer 120, the first oxide spacer 118, the first nitride spacer 116, and the capping layer 114 are substantially coplanar, in accordance with some embodiments. The first oxide spacer 118, the second nitride spacer 120, and the second oxide spacer 122 each have a vertical portion extending along the sidewall of the gate stack 104 and a horizontal portion extending along the upper surface of the semiconductor substrate 102, in accordance with some embodiments.

The second oxide spacer 122, which contacts the ILD layer 124, may provide oxygen atoms for ILD layer 124 to enhance the ability of the ILD layer 124 against dielectric breakdown, in accordance with some embodiments.

Figure 4:
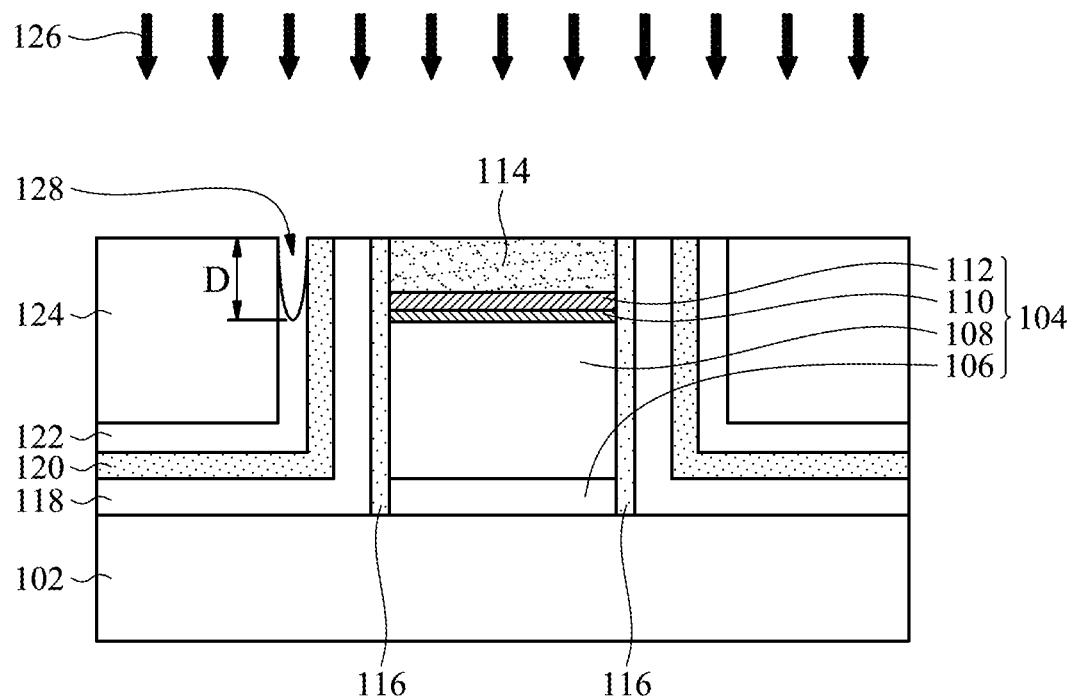

A cleaning process 126 is performed on the semiconductor substrate 102, as shown in FIG. 4, in accordance with some embodiments. In some embodiments, the cleaning process 126 is a post cleaning process after an etching process to clean another region (not shown) of the semiconductor substrate 102. For example, the etching process is used to form a gate structure in another region (not shown) of the semiconductor substrate 102. The cleaning process 126 removes particles, byproducts, and/or oxides, which are produced in the etching process, from the semiconductor substrate 102, in accordance with some embodiments. The cleaning process 126 uses a fluorine-containing solution such as a dilute hydrofluoric (DHF) acid and/or a buffer agent, in accordance with some embodiments.

The cleaning process 126 removes an upper portion of the vertical portion of the second oxide spacer 122, thereby forming a void 128, as shown in FIG. 4, in accordance with some embodiments. The void 128 exposes the sidewall of the ILD layer 124 and the sidewall of the second nitride spacer 120, in accordance with some embodiments. For example, the anneal process performed on the dielectric material 123 (such as SOG) may result in a decrease in the adhesion between the ILD layer 124 and the second oxide spacer 122 and/or forms a gap between the ILD layer 124 and the second oxide spacer 122. Therefore, the fluorine-containing solution of the cleaning process 126 may cause the upper portion of the vertical portion of the second oxide spacer 122 to be peeled off, thereby forming the void 128. In some embodiments, the second oxide spacer 122 on one side of the gate stack 104 is peeled off to form the void 128 while the second oxide spacer 122 on one another side of the gate stack 104 is not peeled off, as shown in FIG. 4.

In some embodiments, the void 128 has a bottom portion having a convex profile. In other words, the upper surface of the second oxide spacer 122 exposed from the void 128 has a concave profile. In some embodiments, the void 128 has a depth D that ranges from about 1 nm to about 20 nm.

Figure 5:
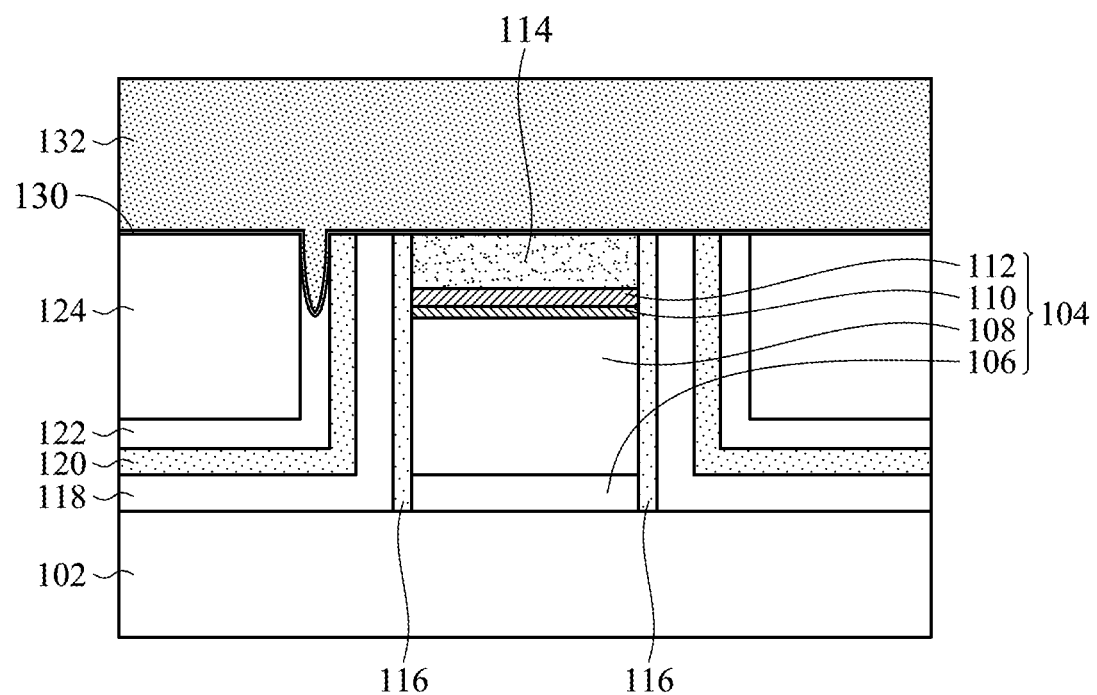

An oxide layer 130 is conformally formed along the sidewalls and the bottom surface of the void 128 (i.e., the sidewall of the ILD layer 124, the sidewall of the second nitride spacer 120, and the upper surface of the second oxide spacer 122 exposed from the void 128), as shown in FIG. 5, in accordance with some embodiments. The oxide layer 130 is further formed along the upper surfaces of the ILD layer 124, the second nitride spacer 120, the first oxide spacer 118, the first nitride spacer 116, and the capping layer 112, in accordance with some embodiments.

In some embodiments, the oxide layer 130 has a thickness that is less than about 5 nm, such as in a range from about 0.5 nm to about 5 nm, such as about 2 nm. In some embodiments, the oxide layer 130 is silicon oxide. In some embodiments, the oxide layer 130 is formed by ISSG, ALD process, CVD, or a combination thereof.

A nitride layer 132 is formed on the oxide layer 130, as shown in FIG. 5, in accordance with some embodiments. The nitride layer 132 is filled into the remaining portion of the void 128 and formed over the ILD layer 124, the second nitride spacer 120, the first oxide spacer 118, the first nitride spacer 116, and the capping layer 114, in accordance with some embodiments. In some embodiments, if the thickness of the oxide layer 130, additional void may be formed in the nitride layer 132 during forming the nitride layer 132.

In some embodiments, the nitride layer 132 is silicon nitride. In some embodiments, the nitride layer 132 is formed by CVD such as PECVD, ALD, or a combination thereof.

Figure 6:
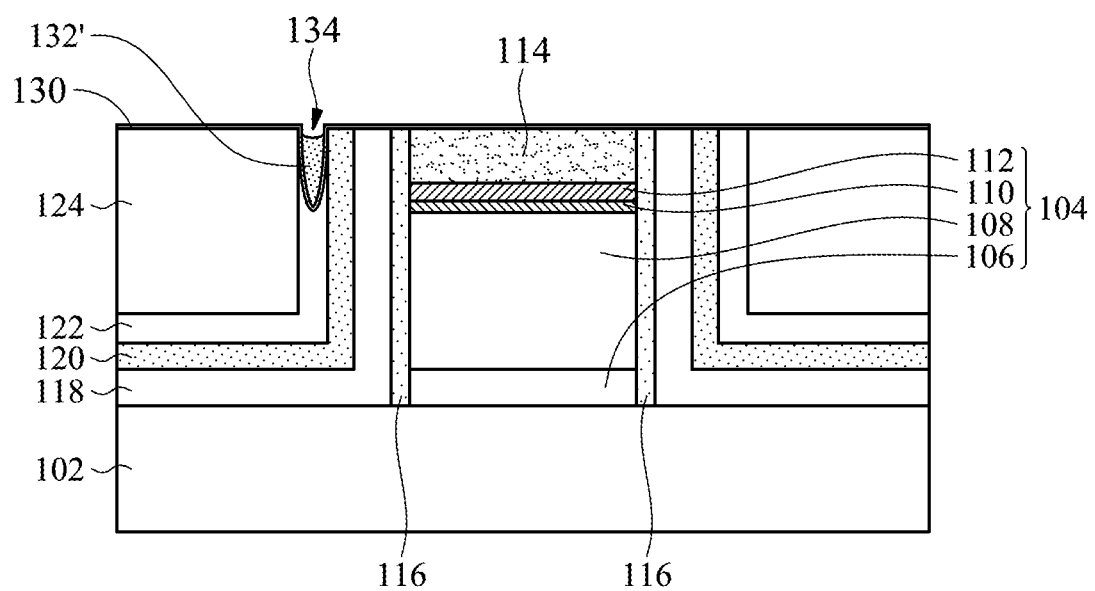

The nitride layer 132, formed over the upper surface of the ILD layer 124, is removed, as shown in FIG. 6, in accordance with some embodiments. The oxide layer 130, formed along the upper surfaces of the ILD layer 124, the second nitride spacer 120, the first oxide spacer 118, the first nitride spacer 116, and the capping layer 114, is exposed after the removal process, in accordance with some embodiments. A remaining portion 132' of the nitride layer 132 remains in the void 128, in accordance with some embodiments. The removal process includes CMP and followed by an etch-back process, in accordance with some embodiments. In some embodiments, the etch-back process is a wet etching using a phosphoric acid.

During the etch-back process, the oxide layer 130 is used as an etching stop layer to protect nitrogen-containing material underlying the oxide layer 130 (e.g., the capping layer 114, the first nitride spacer 116, and/or the second nitride spacer 120) from being removed during the etch-back process, in accordance with some embodiments.

After the etch-back process, the upper surface of the nitride layer 132' is located at a level less than the upper surface of the ILD layer 124 to form a recess 134, as shown in FIG. 6, in accordance with some embodiments. In some embodiments, the recess 132 has a less depth than the void 128, such as less than about 2 nm.

Figure 7:
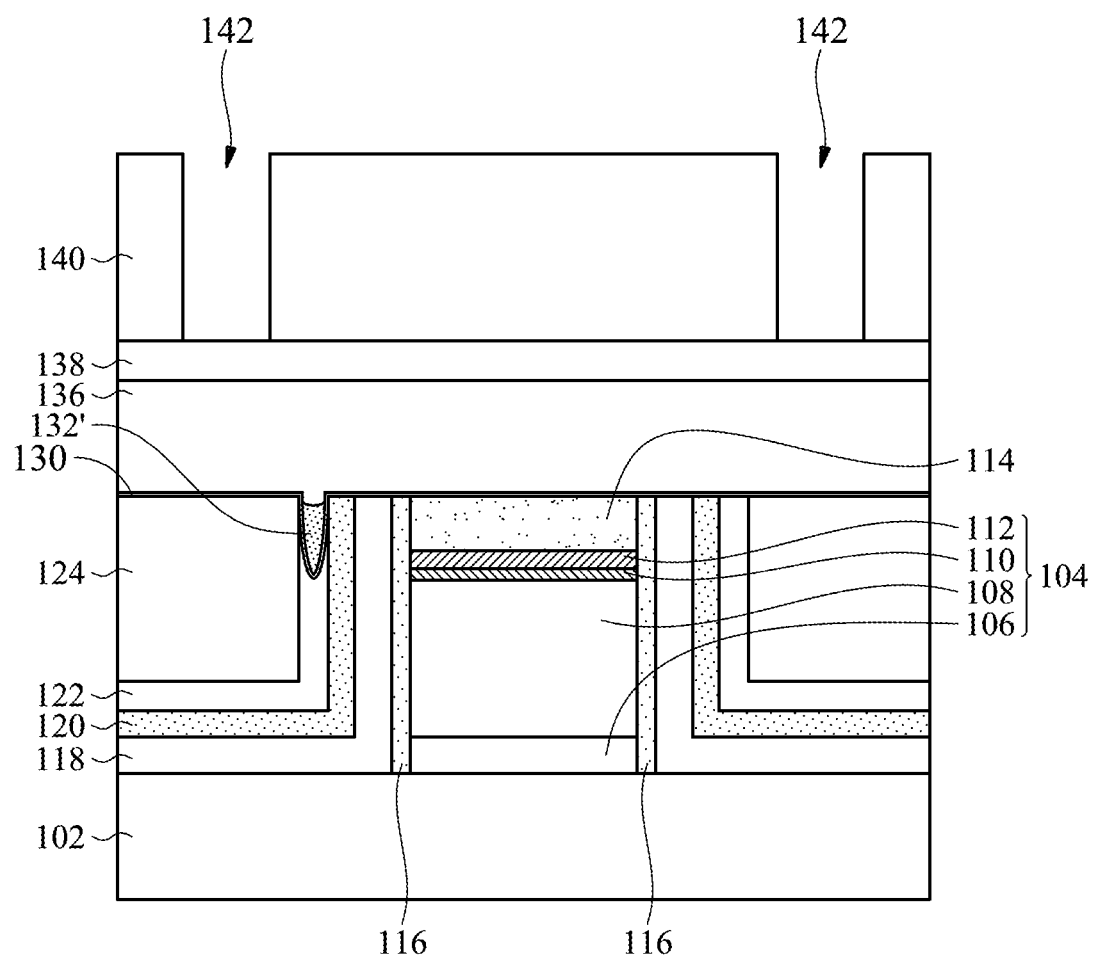

A tri-layer mask structure is formed over the semiconductor substrate 102, as shown in FIG. 7, in accordance with some embodiments. The tri-layer mask structure includes a bottom layer 136, a middle layer 138, and a top layer 140 which are sequentially formed over upper surfaces of the oxide layer 130 and the nitride layer 132', in accordance with some embodiments. A lithography process is performed on the top layer 140 to form openings 142 exposing the upper surface of the middle layer 138, in shown in FIG. 7, in accordance with some embodiments.

In some embodiments, the bottom layer 136 is made of a nitrogen-free material such as carbon or silicon oxycarbide (SiOC). The middle layer is an antireflection coating (ARC) layer such as silicon oxynitride (SiON). The top layer 140 is made of a photoresist material.

Figure 8:
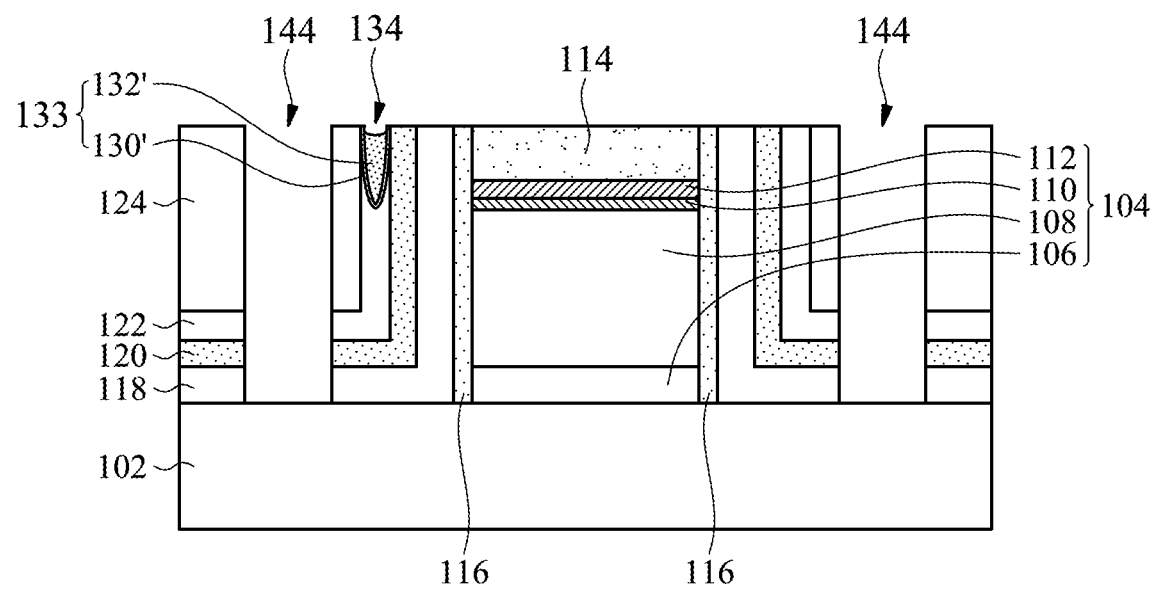

An etching process is performed on the ILD layer 124, the second oxide spacer 122, the second nitride spacer 120, and the first oxide spacer 118 through the openings 142 of the top layer 140 to form openings 144, as shown in FIG. 8, in accordance with some embodiments. The openings 144 pass through the ILD layer 124 and the horizontal portions of the second oxide spacer 122, the second nitride spacer 120, and first oxide spacer 118 to expose the upper surface of the semiconductor substrate 102, in accordance with some embodiments. In some embodiments, the etching process is dry etching.

After the etching process, the tri-layer mask structure above the upper surface of the ILD layer 124 is removed using such as ash process, wet strip process, or a combination thereof, in accordance with some embodiments. A cleaning process is performed on the semiconductor substrate 102, in accordance with some embodiments. The cleaning process removes particles, byproducts, and/or oxides over the semiconductor substrate 102, in accordance with some embodiments. The cleaning process uses a fluorine-containing solution such as a DHF acid and/or a buffer agent.

The cleaning process removes the oxide layer 130 formed over the upper surfaces of the ILD layer 124, the second nitride spacer 120, the first oxide spacer 118, the first nitride spacer 116, and the capping layer 114, in accordance with some embodiments. After the cleaning process, a remaining portion 130' the oxide layer 130 remains in the void 128, in accordance with some embodiments.

The oxide layer 130' and the nitride layer 132' collectively form a protection portion 133, as shown in FIG. 8, in accordance with some embodiments. The protection portion 133 is foiled between the ILD layer 124 and the vertical portion of the second nitride spacer 120, in accordance with some embodiments. The protection portion 133 is formed above the vertical portion of the second oxide spacer 122, in accordance with some embodiments. In some embodiments, the protection portion 133 has a bottom portion that has a convex profile. In some embodiments, the convex profile of the protection portion 133 is mated with and contacts the upper surface of the second oxide spacer 122 having a concave profile. The sidewalls of protection portion 133 are aligned with the sidewalls of the vertical portion of the second oxide spacer 122 in accordance with some embodiments.

A silicide 146 is formed in the bottom surface of the opening 144 (i.e., the upper surface of the semiconductor substrate 102 exposed from the opening 144), as shown in FIG. 9, in accordance with some embodiments. In some embodiments, the silicide 146 is cobalt silicide (CoSi), nickel silicide (NiSi), titanium silicide (TiSi), or a combination thereof. The steps of forming the silicide 146 may include a deposition process, an anneal process, and an etching process.

A barrier layer 148 is conformally formed along the sidewalls of the opening PH (i.e., the surfaces of the ILD layer 124, the second oxide spacer 122, the second nitride spacer 120, the first oxide spacer 118 exposed from opening 144) and the upper surface of the silicide 146, as shown in FIG. 9, in accordance with some embodiments. The barrier layer 148 is further conformally formed along the upper surfaces of the ILD layer 124, the protection portion 133, the second nitride spacer 120, the first oxide spacer 118, the first nitride spacer 116, and the capping layer 114, in accordance with some embodiments. The barrier layer 148 is formed in the recess 134, in accordance with embodiments.

In some embodiments, the barrier layer 148 is made of titanium (Ti), tantalum (Ta), titanium nitride (TiN), tantalum nitride (TaN), or a combination thereof. In some embodiments, the barrier layer 148 is formed by ALD, PVD, or a combination thereof. In some embodiments, before the barrier layer 148 is formed, a pre-cleaning process may be performed on the semiconductor substrate 102. In some embodiments, the pre-cleaning process uses the plasma of a reducing gas, such as argon (Ar) or $NH_3$ plasma, to remove native oxide.

A metal material 150 is formed over the barrier layer 148, as shown in FIG. 10, in accordance with some embodiments. The metal material 150 is filled into the remaining portion of the opening 144, in accordance with some embodiments. The metal material 150 is further formed in the recess 134, in accordance with some embodiments.

In some embodiments, the metal material 150 is tungsten (W), copper (Cu), aluminum (Al), golden (Au), chromium (Cr), nickel (Ni), platinum (Pt), titanium (Ti), or a combination thereof. In some embodiments, the metal material 150 is formed by ALD, PVD, or a combination thereof.

The metal material 150 and the barrier layer 148, formed above the upper surface of the ILD layer 124, is removed to form contacts 152, as shown in FIG. 11, in accordance with some embodiments. In some embodiments, the removal process is CMP.

The contacts 152 pass through the ILD layer 124 and the horizontal portions of the second oxide spacer 122, the second nitride spacer 120, and the first oxide spacer 118 land on the semiconductor substrate 102, in accordance with some embodiments. In some embodiments, the contacts 152 land on and are in electrical connection with source/drain regions of the semiconductor substrate 102.

After the removal process, the upper surfaces of the ILD layer 124, the protection portion 133, the second nitride spacer 120, the first oxide spacer 118, the first nitride spacer 116, and the capping layer 114 are exposed, in accordance with some embodiments. The recess 134 is removed in the removal process so that the upper surfaces of the second nitride spacer 120, the first oxide spacer 118, the first nitride spacer 116, and the capping layer 114 are substantially coplanar, in accordance with some embodiments.

After the contacts 152 are formed, a semiconductor structure 100 is produced. In some embodiments, a capacitor structure (not shown) may be formed over the semiconductor structure 100 to form a DRAM.

In the embodiments of the present disclosure, the semiconductor structure 100 includes the semiconductor substrate 102 and the gate stack 104 disposed over the semiconductor substrate 102. The semiconductor structure 100 also includes the first nitride spacer 116, the first oxide spacer 118, the second nitride spacer 120, and the second oxide spacer 122 sequentially disposed along a sidewall of the gate stack 104. The semiconductor substrate 100 also includes the protection portion 133 disposed above the second oxide spacer 122, and the ILD layer 124 disposed over the semiconductor substrate 102. The protection portion 133 fills the void 128 (shown in FIG. 4) which is formed between the ILD layer 124 and the second nitride spacer 120.

It is worth noting that since the void 128 may laterally extend over the semiconductor substrate 102, if the void 128 is filled with a conductive material, the conductive material may cause a short circuit of the semiconductor device. In the embodiments of the present disclosure, the protection portion 133, formed over the second oxide spacer 122 and filled into the void 128, prevents the conductive material (such as the silicide 146, the barrier layer 148, and/or the metal material 150) from being formed in the void 128. Therefore, the protection portion avoids the electrical reliability issue caused by the formation of the conductive material in the void, thereby increasing the manufacturing yield and reliability of the semiconductor device.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure, comprising:
    a substrate;
    a gate stack disposed over the substrate;
    a first oxide spacer disposed along a sidewall of the gate stack;
    a protection portion disposed over the first oxide spacer, wherein the protection portion comprises an oxide layer and a nitride layer disposed over the oxide layer;
    an ILD layer disposed over the semiconductor substrate, wherein the first oxide spacer and the protection portion are disposed between the gate stack and the ILD layer; and
    a first nitride spacer disposed along the sidewall of the gate stack and between the first oxide spacer and the gate stack,
    wherein the oxide layer is disposed along a sidewall of the ILD layer, an upper surface of the first oxide spacer, and a sidewall of the first nitride spacer.

2. The semiconductor structure as claimed in claim 1, wherein an upper surface of the nitride layer, an upper surface of the ILD layer, and an upper surface of the first nitride spacer are substantially coplanar.

3. The semiconductor structure as claimed in claim 1, further comprising:
    a second nitride spacer disposed along the sidewall of the gate stack and directly contacting the gate stack; and
    a second oxide spacer disposed along the sidewall of the gate stack and between the first nitride spacer and second nitride spacer.

4. The semiconductor structure as claimed in claim 1, wherein a sidewall of the protection portion is aligned with a sidewall of the first oxide spacer.

5. The semiconductor structure as claimed in claim 1, further comprising:
    a contact through the ILD layer and landing on the semiconductor substrate.

6. The semiconductor structure as claimed in claim 1, further comprising:
    a capping layer disposed over the gate stack, wherein an upper surface of the protection layer and an upper surface of the capping layer are coplanar.

7. A method for fabricating the semiconductor structure as set forth in claim 1, comprising:
    providing the semiconductor substrate;
    forming the gate stack over the semiconductor substrate;
    forming the oxide spacer along the sidewall of the gate stack;
    forming the nitride spacer along the sidewall of the gate stack, wherein the nitride spacer is located between the oxide spacer and the gate stack;
    forming the ILD layer over the semiconductor substrate, wherein the oxide spacer is located between the ILD layer and the gate stack;
    removing an upper portion of the oxide spacer to form a void; and
    forming the protection portion in the void.

8. The method for fabricating the semiconductor structure as claimed in claim 7, wherein removing the upper portion of the oxide spacer comprises a cleaning process that uses a fluorine-containing solution.

9. The method for fabricating the semiconductor structure as claimed in claim 7, wherein the upper portion of the oxide spacer is removed to expose the ILD layer and the nitride spacer.

10. The method for fabricating the semiconductor structure as claimed in claim 7, wherein forming the protection portion comprises:
    forming the oxide layer along sidewalls and a bottom surface of the void and an upper surface of the ILD layer; and
    forming the nitride layer on the oxide layer to fill the void.

11. The method for fabricating the semiconductor structure as claimed in claim 10, wherein forming the protection portion further comprises:
    removing a portion of the nitride layer over the upper surface of the ILD layer.

12. The method for fabricating the semiconductor structure as claimed in claim 11, wherein removing the portion of the nitride layer includes an etch-back process in which the oxide layer is used as an etching stop layer.

13. The method for fabricating the semiconductor structure as claimed in claim 11, further comprising:
   removing a portion of the oxide layer formed along the upper surface of the ILD layer.

14. The method as claimed in claim 7, further comprising:
   patterning the ILD layer to form an opening that passes through the ILD layer and exposes the semiconductor substrate.

15. The method for fabricating the semiconductor structure as claimed in claim 7, wherein:
   the oxide spacer is further formed along an upper surface of the semiconductor substrate, and
   the opening passes through the oxide spacer.

16. The method for fabricating the semiconductor structure as claimed in claim 14, further comprising:
   filling the opening with a conductive material.

* * * * *